United States Patent [19]

Hendrickson

[11] 4,295,057
[45] Oct. 13, 1981

[54] DUAL SIGNAL CONTROL SYSTEM

[75] Inventor: Thomas E. Hendrickson, Wayzata, Minn.

[73] Assignee: Honeywell Inc., Minneapolis, Minn.

[21] Appl. No.: 92,785

[22] Filed: Nov. 8, 1979

[51] Int. Cl.³ .......................... H03K 5/22; H03K 5/00
[52] U.S. Cl. .................................. 307/231; 307/517; 307/584; 328/114; 328/132
[58] Field of Search ............... 307/231, 232, 251, 297, 307/243, 247; 328/114, 127, 132, 133

[56] References Cited

U.S. PATENT DOCUMENTS

| | | | |
|---|---|---|---|
| 2,489,297 | 11/1949 | Labin et al. | 328/114 |
| 3,107,306 | 10/1963 | Dobbie | 307/231 |
| 3,567,961 | 3/1971 | Koechner | 307/232 |
| 3,646,455 | 2/1972 | Cocagna | 328/133 |
| 3,654,516 | 4/1972 | Traversi | 328/132 |
| 3,659,209 | 4/1972 | Packette | 328/132 |

Primary Examiner—Larry N. Anagnos
Assistant Examiner—B. P. Davis
Attorney, Agent, or Firm—Theodore F. Neils

[57] ABSTRACT

An electronic control circuit is provided which operates on selected characteristics of oppositely phased control signals. A logic arrangement sorts out those signal portions having the selected characteristics to provide an output signal.

16 Claims, 10 Drawing Figures

FIG. 4

| CONDITION | CONTROL INPUT SIGNALS | | DETECTOR OUTPUT SIGNALS | | | | FLIP-FLOP 32 SIGNALS | | | SWITCH CONDITION (33) |
|---|---|---|---|---|---|---|---|---|---|---|
| | A | B | RA | RB | FA | FB | R | S | Q | SWITCH |
| 1 | STEADY STATE (S.S.) | STEADY STATE (S.S.) | LOW (0) | LOW (0) | LOW (0) | LOW (0) | LOW (0) | LOW (0) | * | * |
| 2 | ⌐H(1)⌐L(0) | S.S. | ⊓(1)→←T ⌐(0) | LOW (0) | LOW (0) | LOW (0) | LOW (0) | LOW (0) | * | * |
| 3 | ⌐H(1)⌐L(0) | S.S. | LOW (0) | LOW (0) | ⊓(1)→←T ⌐(0) | LOW (0) | LOW (0) | LOW (0) | * | * |
| 4 | S.S. | ⌐H(1)⌐L(0) | LOW (0) | ⊓(1)→←T ⌐(0) | LOW (0) | LOW (0) | LOW (0) | LOW (0) | * | * |
| 5 | S.S. | ⌐H(1)⌐L(0) | LOW (0) | LOW (0) | LOW (0) | ⊓(1)→←T ⌐(0) | LOW (0) | LOW (0) | * | * |
| 6 | ⌐H(1)⌐L(0) | ⌐H(1)⌐L(0) | ⊓(1)⌐(0) | LOW (0) | LOW (0) | ⊓(1)⌐(0) | LOW (0) | HIGH (1) | HIGH (1) | ON |
| 7 | ⌐H(1)⌐L(0) | ⌐H(1)⌐L(0) | LOW (0) | ⊓(1)⌐(0) | ⊓(1)⌐(0) | LOW (0) | HIGH (1) | LOW (0) | LOW (0) | OFF |

\* NO CHANGE 4,295,057

DUAL SIGNAL CONTROL SYSTEM

BACKGROUND OF THE INVENTION

The present invention is related to electronic switching circuits for controlling devices or systems connected to the circuit output, and more particularly, to electronic switching circuits receiving dual input signals, and to direct, in turn, a device or a system which often will be the primary device controlling power transfers in a power circuit containing a substantial power consuming load means.

In many circuit uses for electronic switching control circuits of the kind involved in controlling power transfers between a power source and a power consuming load, the control circuit will operate from a relatively low voltage, constant polarity power supply or supplies. On the other hand, the power circuit over which control is exercised will operate from a relatively high value voltage supply, and this voltage may be either a constant polarity voltage or an alternating polarity voltage.

This typical situation can be found, for instance, in the circuits disclosed in a copending application by T. E. Hendrickson, et al., entitled "Alternating Polarity Power Supply Control Apparatus" having serial No. 973,463 which employs, in the circuits disclosed therein, metal-oxide-silicon field-effect devices capable of controlling substantial amounts of power. Such devices are disclosed in a copending application by T. E. Hendrickson, et al., entitled "Semiconductor Apparatus" having Ser. No. 024,840. Both of these copending applications are assigned to the same assignee as the present application.

Further, the constant polarity, low voltage operated controlling circuit will often be in two parts with the first part remotely located from the electronic switching circuit, and with the second part immediately connected to and directing operation of the primary power transfer controlling element. In the example of the copending applications just referred to, this primary element would be the metal-oxide-silicon, field-effect device therein mentioned or described. Thus, relatively long electrical interconnection lines, or transmission lines, forming a transmission channel would be present for connecting the constant polarity, low voltage operated control system of the first part—usually a logic system—to the remotely located electronic switching control circuit of the second part which is immediately connected to the power circuit. Such long transmission lines provide the opportunity for substantial pickup of electrical noise which can disrupt proper control functions.

A possibility for reducing the chances that electrical noise pickup on the control lines will disrupt the control operation is based on providing dual electrical transmission lines for each control channel present. By having, as the remote electronic switching circuit, one which accepts commands through the channel as being valid only when command changes in signals occurring on one member of the pair of channel lines is accompanied by opposite changes in the signals present on the other member, noise pickup can be discriminated against relatively well. This is true because electrical noise pickup would result in common changes occurring in the signals on both lines; that is, the noise induced changes would be in the same direction.

Thus, to use this technique, an electronic switching circuit is required which would discriminate between (i) common changing signals occurring at a pair of signal inputs thereto, and (ii) opposite changing signals at these inputs. Such a capability would provide the basis for an initial circuit to generate control signals to command selected operations in the power circuit to which the discriminating circuit is to be connected. Furthermore, such an electronic switching system should provide electrical isolation between the power circuit and the initial circuit serving as the source of the two command input signals to prevent any interaction between this source and the power circuit.

SUMMARY OF THE INVENTION

The present invention provides an electronic circuit which is capable of receiving as inputs, two control signals and providing an output signal, changing in correspondence to changes in value of a selected one of these input control signals, which is used to direct operation of a subsequent device or system. However, this circuit will provide an output signal with such corresponding changes only when the remaining input signal has opposite direction value changes occurring therein sufficiently close in time to the changes in the selected input signal. The source of these incoming control signals is electrically isolated by the present electronic circuit from certain kinds of circuit voltages occurring either in the circuit itself or in the subsequent device or system which the circuit controls.

The electronic circuit provided is implemented by use of rising signal detectors and falling signal detectors to determine the occurrence of magnitude changes in, and the direction of these changes in, each of the capacitively coupled input control signals. The outputs from these detectors are provided to a logic system which sorts the output signals of these detectors to accept only those changes therein corresponding to input control signal changes which occur in the opposite direction in each of the input control signals, and which occur therein sufficiently contemporaneously. This acceptance is the basis for providing an output signal to control subsequent devices or systems.

BRIEF DESCRIPTION OF THE DRAWINGS

FIG. 4 is a dynamic truth table for signals occurring in the circuit of FIG. 1.

DESCRIPTION OF THE PREFERRED EMBODIMENTS

Figure 1:
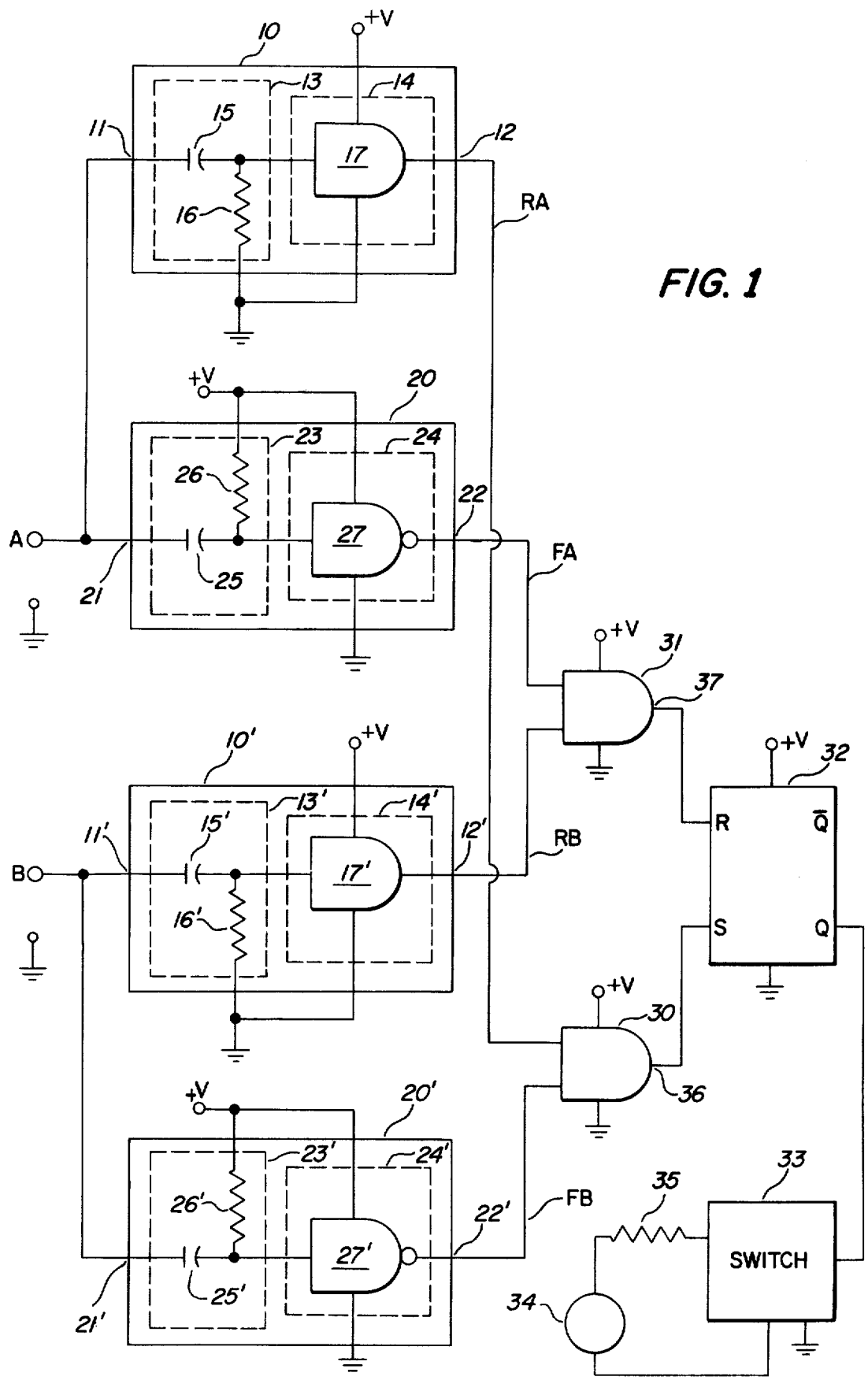
FIG. 1 is a schematic circuit diagram showing one embodiment of the invention.

An electronic switching circuit, as an embodiment of the present invention, is shown in the schematic circuit diagram of FIG. 1. The switching circuit includes a pair of rising signal detectors, 10 and 10', and a pair of falling signal detectors, 20 and 20'. Further provided in this circuit is a logical sorting means including a pair of logic AND gates, 30 and 31, and further including an R-S flip-flop, 32.

The output of the electronic switching circuit of FIG. 1 is intended to provide a logic output signal sufficient in magnitude and rate of change to direct a power circuit including a switch means, 33, a power source, 34, and a load means, 35. Switch 33 is an electronic or electromechanical primary power control device controlling power transfers from power source 34 to load means 35. Source 34 may be either a constant or an alternating polarity electrical power source depending on the nature of load means 35, etc.

The electronic switching circuit of FIG. 1, is provided with two control signals, A and B. Control signal A is provided at an input terminal region, 11, of rising signal detector 10. Rising signal detector 10 is capable of providing an output indication at an output terminating region thereof, 12, if control signal A has an increase in value which exceeds a selected magnitude and also exceeds a selected rate of increase. The magnitude and rate of increase requirements of rising signal detector 10 will be discussed below. Control signal A is also provided at an input terminal region, 21, of falling signal detector 20. Falling signal detector 20 is capable of providing an output indication at an output terminating region thereof, 22, if control signal A has a decrease in value which exceeds a selected magnitude and also exceeds a selected rate of decrease. The output signal of rising signal detector 10 is designated RA, and the output signal of falling signal detector 20 is designated FA.

Similar to control signal A, control signal B is provided to rising signal detector 10' and falling signal detector 20' which are identical in configuration to rising signal detector 10 and falling signal detector 20, respectively. Control signal B is provided at an input terminal region, 11', of rising signal detector 10'. Rising signal detector 10', being identical in configuration to rising signal detector 10, is capable of providing an output signal at an output terminating region thereof, 12', if control signal B has an increase in value which exceeds a selected magnitude and also exceeds a selected rate of increase. Control input signal B is also provided at an input terminal region, 21', of falling signal detector 20'. Falling signal detector 20', being identical in configuration to falling signal detector 20, is capable of providing an indication at an output terminating region thereof, 22', if control signal B has a decrease in value which exceeds a selected magnitude and also exceeds a selected rate of decrease. The output signal of rising signal detector 10' is designated RB, and the output signal of falling signal detector 20' is designated FB.

The outputs of rising signal detector 10 and 10' and falling signal detectors 20 and 20' provide input signals to 2-input logical AND gates 30 and 31 in the logical sorting means. The inputs to AND gate 30 are connected to the outputs 12 and 22' of detectors 10 and 20', respectively. Thus, the input signals to gate 30 are output signal RA of rising signal detector 10 and output signal FB of falling signal detector 20'. The output, 36, of AND gate 30 is connected to an input, S(SET), of standard R-S flip-flop 32. The inputs of AND gate 31 are connected to the outputs 12' and 22 of detectors 10' and 20, respectively. Thus, the input signals to gate 31 are output signal FA of falling signal detector 20 and output signal RB of rising signal detector 10'. The output, 37, of AND gate 31 is connected to another input, R (RESET), of flip-flop 32.

R-S flip-flop 32 has an output, Q, which is shown connected to switch 33 of the power circuit. The $\overline{Q}$ output could be used if switch 33 performs an inversion on the input signal thereto, or if otherwise convenient.

Logical AND gates 30 and 31, and R-S flip-flop 32 together provide a logical sorting means for sorting the outputs of rising signal detectors 10 and 10' and falling detectors 20 and 20'. This sort is accomplished such that an output signal, occurring at the Q output of flip-flop 32, is indicative of the phase of control signal A, but only whenever control signals A and B are appropriately phased as will be described below.

Turning to the system operation, first note that rising signal detector 10', receiving control signal B, is identical in configuration and operation to rising signal detector 10, receiving control signal A. Hence, only rising signal 10 and its operation need be described to understand both of these detectors.

Rising signal detector 10 includes a rate of change circuit, 13, and a threshold switch circuit, 14. The input of rate of change circuit 13 is connected to input terminal region 11 of rising signal detector 10. The output of rate of change circuit 13 is connected to the input of threshold switch circuit 14. Rate of change circuit 13 includes a capacitor, 15, connected between the input of circuit 13 and its output. A resistor 16 is connected between the output of rate of change circuit 13 and the most negative potential in that circuit, ground.

Capacitor 15 and resistor 16 form a "differentiator circuit." In such a differentiator circuit, the output voltage approaches the derivative of the input voltage scaled by the circuit time constant with the approximation being poorest at discontinuities in the input signal. Furthermore, capacitor 15 of rate of change circuit 13 provides electrical isolation between direct voltage levels occurring in the input control signal A and any direct voltage levels occurring in differentiator circuit 13 or beyond.

The output of threshold switch circuit 14 is connected to the output terminating region 12 of rising signal detector 10. Threshold switch circuit 14 is any circuit requiring an input voltage to exceed some approximately constant threshold voltage in order to switch the output of the threshold switch circuit from a low voltage logic level to a high voltage logic level. One example of a threshold switch circuit 14 is a 1-input AND gate 17 as shown in FIG. 1. AND logic gates typically require the input voltage thereto (the output of rate of change circuit 13 for AND gate 17 in FIG. 1) to exceed, for example, 0.5 volts in order to switch the AND gate output to a logic high (in a positive logic system). When the input voltage is less than 0.5 volts, the AND gate output is at a logic low.

The operation of rising voltage detector 10 will now be described with reference to FIG. 1. A "positive logic" system is used herein, i.e., the more positive logic voltage level (approximately +V) is a logic one, and the more negative voltage level (approximately ground) is a logic zero.

When control signal A is a voltage which does not vary or does not vary sufficiently rapidly with time, for whatever values control signal A takes, the output voltage of the rate of change circuit 13 is near ground. Subsequently, the input to threshold switch circuit 14 is also at ground, i.e. a logic zero, causing the threshold switch circuit output to also be a logic zero or at a low voltage level. If the control signal A decreases from a first voltage to a lower voltage, the output of the rate of change circuit 13 will go negative with respect to ground because of capacitor 15, thus keeping the input to threshold switch circuit 14 below the threshold thereof or at a logic zero.

On the other hand, if the control signal A voltage rises sufficiently fast (rate of increase) and by a sufficient magnitude, the output voltage of the rate of change circuit 13 will exceed the threshold voltage of threshold switch circuit 14 causing the output of threshold switch circuit 14 to provide a high voltage logic level, i.e. a logic one. If the control signal A voltage value remains at the same high voltage level to which it has risen, the output of rate of change circuit 13 will return to the ground potential because of the differentiator action caused by capacitor 15 and resistor 16. This latter action will cause the output of threshold switch circuit 13 to return to a low voltage logic level, i.e. a logic zero.

The differentiator circuit, including capacitor 15 and resistor 16, determines the minimum rate of rise of control signal A required to switch the threshold switch 14. In the case where control signal A is a fast pulse change in voltage from zero to a value in excess of the threshold switch threshold voltage, the threshold switch circuit will respond with an output pulse of pulse duration of width T substantially determined by the RC time constant of the differentiator circuit as fixed by circuit members, capacitor 15 and resistor 16. If the rate of increase of control signal A is too slow, the differentiator circuit output voltage will never exceed the threshold voltage of threshold switch circuit 14, and the output of threshold switch circuit 14 will not provide an output pulse. Thus, when control signal A increases by a sufficient magnitude in excess of the circuit 14 threshold voltage, and exceeds a sufficient rate of increase, the rising voltage detector 10 will provide an output pulse starting from a low voltage logic level, going to a high voltage logic level, and returning to a low voltage logic level.

Falling signal detector 20 of FIG. 1 is similar in form to that of rising signal detector 10 but with an inverse capability. Falling signal detector 20 provides an indication at its output terminating region 22 if control signal A has a decrease in value which exceeds a selected magnitude and also exceeds a selected rate of decrease. Falling signal detector 20' receiving control signal B is identical to falling signal detector 20 receiving control signal A and so only falling signal detector 20 and its operation need be described to understand both detectors.

Falling signal detector 20 includes a rate of change circuit, 23, and a threshold switch circuit, 24. The input of rate of change circuit 23 is connected to input terminating region 21 of falling signal detector 20. The output of rate of change circuit 23 is connected to the input of threshold switch circuit 24. Rate of change circuit 23, like rate of change circuit 13, includes a capacitor, 25, and a resistor, 26, to form a "differentiator circuit." Capacitor 25 is connected between the input and the output of rate of change circuit 23. Resistor 26 is connected between the output of rate of change circuit 23 and a positive reference voltage source +V having a voltage value exceeding the threshold of threshold switch circuit 24.

The output of threshold switch circuit 24 is connected to output terminating region 22 of falling signal detector 20. The threshold switch circuit 24 of falling signal detector 20 is shown as a logic NAND gate 27 which performs logic inversion of the output of the rate of change circuit 23 as will be more fully described. Gate 27 will also have an approximately constant threshold voltage, for instance 0.5 volts. Varying input voltages about the threshold to gate 27 will cause the gate output to be in either a low or high voltage level logic state, just as for circuit 14, but with the opposite relationship between the input and output voltage levels.

The operation of falling signal detector 20 will now be described. When control signal A is a voltage which either does not vary or does not vary sufficiently rapidly with time, for whatever values control signal A takes, the output of rate of change circuit 23 remains at positive reference voltage source +V. Thus, the rate of change circuit output voltage +V represents a logic one input to NAND gate 27, such that the output of NAND gate 27 is the complement or logic inverted input signal, i.e., a logic zero. If control signal A increases from a first voltage to a higher voltage, the output of rate of change circuit 23 remains positive such that it exceeds the threshold voltage of NAND gate 27 thus maintaining the output voltage of NAND gate 27 at a logic zero.

On the other hand, if control signal A voltage decreases sufficiently fast (rate of decrease) and by a sufficient magnitude, the output of rate of change circuit 23 will fall below the threshold voltage of threshold switch circuit 24 causing the output of the threshold switch circuit 24 to change to a logic one. If control signal A voltage remains at the same low voltage level to which it has fallen, the output of rate of change circuit 23 will return to the positive reference voltage +V because of the differentiator action caused by capacitor 25 and resistor 26. This latter action will cause the output of threshold switch circuit 24 to return to a logic zero.

Thus, when control signal A has a decrease in value which exceeds a selected magnitude and also exceeds a selected rate of decrease, falling signal detector 20 will produce an output pulse indicative of that occurrence. Like rising signal detector 10, the differentiator including capacitor 25 and resistor 26 determines the minimum rate of decrease for control signal A required to switch threshold switch circuit 24. Furthermore, the RC time constant of the differentiator substantially determines the output pulse duration of width, T, of threshold switch circuit 24.

The electronic switching circuit of FIG. 1 will now be described with reference to the dynamic truth table shown in FIG. 4. Also shown in FIG. 4 is the status of the R-S flip-flop and the condition of switch 33. Switch 33 is assumed to be "on" when the output Q of RS flip-flop 32 is at a high voltage level or logic one, and is "off" when Q is at a low voltage level or a logic zero. The description which follows assumes that the desire is for the "off" or "on" condition of switch 33 to follow the logic state or phase of control signal A. That is, when control signal A is at a high voltage level or logic one, load switch 33 is desired to be "on" such that the power is being transferred to load 35 by power source 34. When control signal A is at a low voltage level or logic zero, load switch 33 is desired to be "off" so that no power is being transferred to load 33. Furthermore, load switch 33 is only to respond to control signal A on the condition that control signal B is directed oppositely in taking values with respect to values being taken by control signal A. That is, control signal B is to have opposite phase synchronism to that of control signal A.

A typical source of control signals A and B is a control device remote from the installation containing the apparatus of FIG. 1. This control device provides a two logic state signal, either high or low voltage levels as ones and zeros, respectively, for control signal A. The control device also provides the logical complement of control signal A as control signal B. For example, when A is +5 volts then B is at a value of ground, A is represented in the logic one state and B in the logic zero state. When A next changes to ground in value, B would then change to +5 volts. The switching circuit of FIG. 1 discriminates between properly related changes in control signals A and B. If control signal A and B change value independently, i.e., are not changing value in opposite directions nearly concurrently, switch 33 is not to be permitted to change state in correspondence with the change in signal A. If control signals A and B both change from a first voltage value to a higher voltage value, i.e., are in phase, switch 33 is also not to be permitted to change state. This latter situation is typically the case encountered on relatively long electrical interconnection lines or transmission lines because of the opportunity these provide for substantial pick-up of electrical noise which can disrupt the control operation. Electrical noise pick-up usually results in common changes occurring in the signals on both the wire carrying control signal A and on the wire carrying control signal B, resulting in these changes in the signals being in the same direction.

Shown in FIG. 4 are various selected logic states and conditions which can occur in the apparatus of FIG. 1 including those for (i) control input signals A and B, (ii) those for the output signals RA and RB of rising signal detectors 10 and 10' respectively, (iii) those for the output signals FA and FB of falling signal detectors 20 and 20' respectively, (iiii) those at the inputs R and S and at the output Q of RS flip-flop 32, and (v) the condition of switch 33. The "*" shown in FIG. 4 is to indicate that although a change in an input may have occurred, the state of the output of flip-flop 32, Q, or the condition of switch 33 has not changed.

Referring now to FIG. 4, condition 1, there shown is the case where control signal A and control signal B are constant with time or varying only too slowly to provide signals sufficient to switch any of the threshold switch circuits in FIG. 1. Accordingly, the outputs RA and RB of rising signal detectors 10 and 10' and the outputs FA and FB of falling signal detectors 20 and 20' are all at a low level or logic zero. With the outputs of all signal detectors at a logic zero, the outputs of AND gates 30 and 31 are also at a logic zero, resulting in making the R-input and the S-input of flip-flop 32 also logic zeros. With the R and S inputs at logic zeros, the output Q of flip-flop 32 will remain in its previous state ("*"), i.e. no change.

The situations in which only one of the two control signals has a voltage level change is shown in conditions 2 thru 5. Referring to condition 2, if control signal A changes from low to high or from a logic zero to a logic one, the output RA of rising signal detector 10 is a pulse reaching a logic one and having a duration T. However, at the same time, the other detector output signals RA, FA, and FB remain logic zeros. Accordingly, the outputs of AND gates 30 and 31 remain logic zeros resulting in the R and S inputs of flip-flop 32 also remaining logic zeros. Thus, no change in state of flip-flop 32 output Q occurs because only one of the signal detectors produced a pulse within the time duration T, i.e., rising signal detector 10 having output signal RA.

Condition 3 shows the case where an output pulse is only produced by falling signal detector 20, with output FA, when control signal A changes from a logic one to a logic zero. Because, again, a pulse is produced in just one of detector output signals while the remaining detector output signals continue as logic zeros, the R and S inputs also remain at a logic zeros such that flip-flop 32 does not change state.

Conditions 4 and 5 are similar to conditions 2 and 3. Here, independent pulses produced in the output signals of rising signal detector 10' or falling signal detector 20', due to changes in control signal B, cause no change in the output state of flip-flop 32 as seen at output Q thereof.

Condition 6 of FIG. 4 shows the normal operating condition when the switch 33 is presumed "off" and the desire is for switch 33 to become switched "on". This can occur by causing the S input of flip-flop 32 to go to a logic one with the R-input remaining at a logic zero thereby causing the Q-output to be a logic one. This situation will occur if control signal A goes from a low voltage level or logic zero, to a high voltage level, or logic one, concurrently with control signal B going from a high level voltage, or logic one, to a low level voltage, or logic zero.

In this situation, control signal A causes a pulse in output signal RA of rising signal detector 10 (just as in condition 2 discussed above), and control signal B causes a pulse in output signal FB of falling signal detector 20' (just as in condition 5 mentioned above). The two output signal pulses provided by rising signal detector 10 and falling signal detector 20' causes AND gate 30 to produce a logic one, which is connected to the S-input to flip-flop 32. Detectors 20 and 10' detect the opposite signal change condition in control signals A and B, respectively, from the signal change condition detected by detectors 10 and 20'. Hence, no pulses are provided in output signals FA and RB of falling signal detector 20 and rising signal detector 10', respectively, just as in conditions 2 and 5. Thus, the output of AND gate 31 remains a logic zero as does the R-input of flip-flop 32 connected thereto.

As shown in FIG. 4, a logic zero at the R-input and a logic one at the S-input sets flip-flop 32 causing the Q output to go to a logic one. Accordingly, the switch 33 is switched "on" to permit the transfer of electrical power from alternating polarity (could be constant polarity) source 34 to the load 35. After a time equal to a pulse width T, one pulse width being determined by each of the differentiator circuits 13 and 23' in rising signal detector 10 and falling signal detector 20', respectively, the output signal RA of detector 10 and the output signal RB of detector 20' each return to a logic zero. The pulse widths in each circuit may differ to some extent. The output of AND gate 30 will then also return to logic zero as does the input S of flip-flop 32 connected thereto. However, the Q output of flip-flop 32 remains at logic one since both R and S are then at logic zeros thus maintaining Q at logic one and leaving switch 33 in the "on" condition.

Changing switch 33 to an "off" state from an "on" state is shown in FIG. 4 under condition 7. There shown is control signal A changing from a high voltage level, or logic one, to a low voltage level, or logic zero, causing a pulse in output signal FA from falling signal detector 20 (just as in condition 3 described above). Simultaneously shown is control signal B changing from a low voltage level, or logic zero, to a high voltage level, or logic one, causing a pulse in output signal RB from rising signal detector 10' (just as in condition 4 mentioned above). No pulses are produced in output signal RA from rising signal detector 10 or in output signal FB from falling signal detector 20'.

The pulses produced in output signals FA and RB cause the output of AND gate 30 to go to a logic one, which is connected to the R-input of flip-flop 32. Because there are no pulses produced in output signals RA and FB, the output of AND gate 30 remains at a logic zero which is provided to the S-input of flip-flop 32. With the R-input at a logic one and the S-input at a logic zero, flip-flop 32 is reset causing output Q thereof to go to a logic zero. This causes switch 33 to switch to the "off" condition so that no power is transferred to load means 35.

The electronic switching circuit shown in FIG. 1 requires that control signal A change voltage levels, i.e., logic states, at substantially the same time that control signal B, at least initially the complement of signal A, also changes logic state—that is, opposite phase synchronism. The time difference between such complementary signal changes occurring in control signal A and in control signal B—that is, the degree of lack of time congruency—permitted by the discriminator shown in FIG. 1 depends upon the pulse widths produced by the various signal detectors. As described earlier, the pulse width produced by the signal detectors in response to a fast rise or fall time of the control input signal is determined substantially by the time constant in the differentiator circuits in these detectors. Any overlap of the pulses produced in the output signals of these signal detectors caused in the output signals of these control signals A and B will cause the appropriate switching of switch 33.

For example, if an effective one to zero change in logic state of control signal B is delayed by an amount of time equivalent to pulse width T with respect to an effective zero to one change in the logic state of control signal A, the pulse in output signal RA produced by the rising signal detector 10 will not overlap the pulse produced in output signal FB by falling signal detector 20'. Thus, AND gate 30 will remain at a logic zero. Assuming that the falling signal detector 20 and rising signal 10' did not produce any output signal pulses, as they should not in this situation, the output of both AND gates 30 and 31 will be at logic zeros as will be the S and R inputs to flip-flop 32 connected to these AND gate outputs, respectively. Thus, there will be no change in state of flip-flop 32, so that switch 33 will remain in the same condition.

On the other hand, if the delay of the control signal B is sufficiently less than the amount of time equivalent to pulse width T to thereby cause the appropriate switching of AND gate 30 and flip-flop 32, switch 33 will change state such that switch 33 will switch "on". Thus, the discriminator circuit of FIG. 1 will not change the state of flip-flop 32 and the condition of switch 33 unless control signal A and control signal B have substantially opposite-phase synchronism. Electrical transients or noise will not cause switching of switch 33 except in the unlikely event of having noise effects present in control signals A and B such that changes occurring in these signals are appropriately phased and are sufficiently concurrent (occur within the pulse width time T). Of course, making the time constants of the "differentiator circuits" in the detectors as small as possible is desirable to discriminate against noise disruptions occurring in control signals A and B. The capacitor and resistor values in ranges normally producible in standard MOS integrated circuitry have been found adequate to yield good results.

Figure 2:
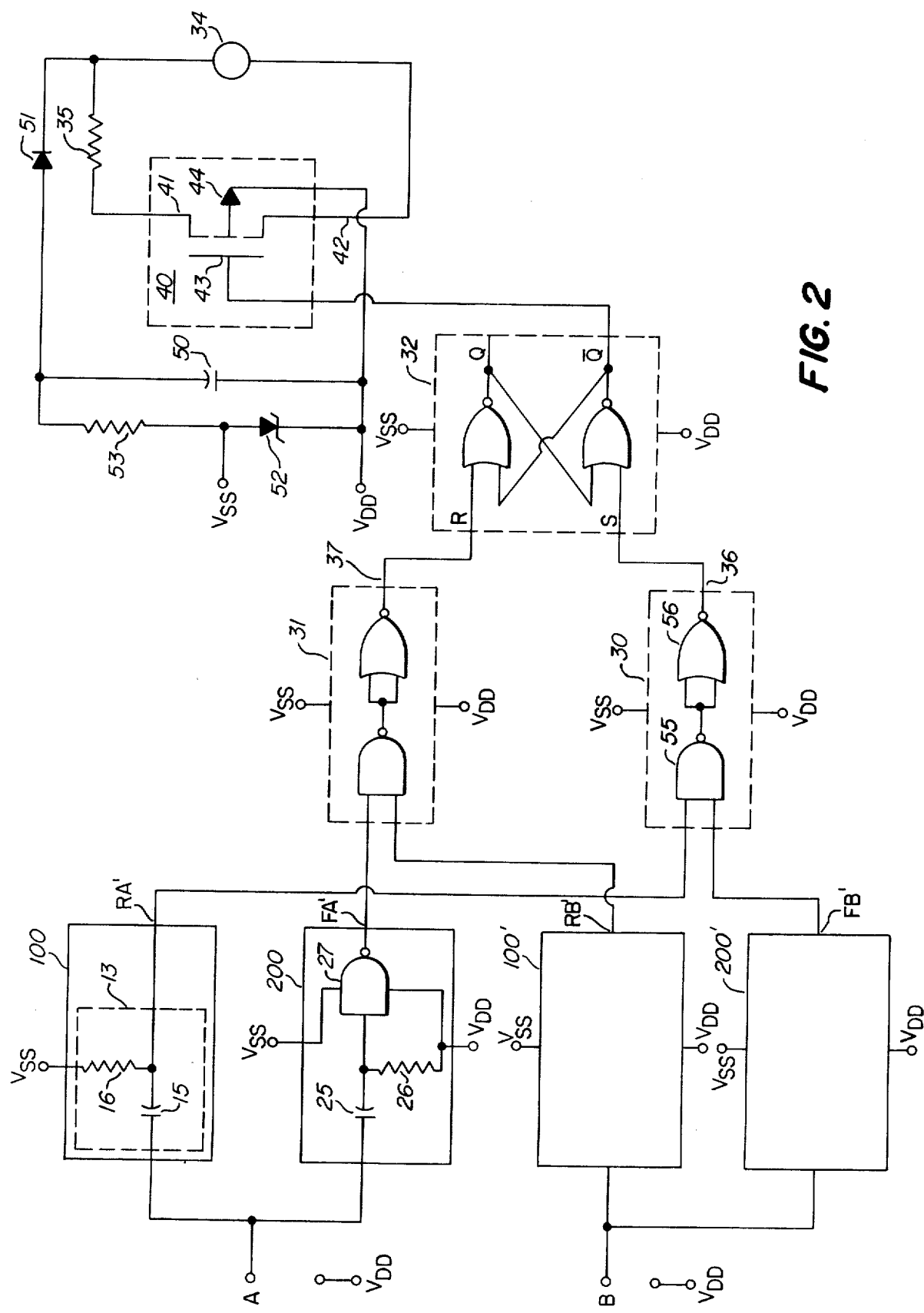
FIG. 2 is a schematic circuit diagram showing another embodiment of the invention.

Shown in FIG. 2 is a schematic circuit diagram of an alternative embodiment of the invention. The circuit of FIG. 2 retains the functional aspects of the circuit of FIG. 1 although drawn in a somewhat different form. The circuit entities of FIG. 2 which have sufficiently close counterparts in the circuit entities of FIG. 1 are identified with the same numeral designations in FIG. 2 as were used to identify the counterparts in FIG. 1.

Specifically, the circuit of FIG. 2 shows switch 33, the primary device controlling power transfers from power source 34 to load means 35, as a p-channel, metal-oxide-semiconductor field effect transistor (MOSFET) device. Furthermore, the circuit logic elements are shown in a form suitable for integration in monolithic integrated circuits of the type wherein p-channel MOSFET's are provided. Thus all of the circuit components in FIG. 2, including the primary power transfer control field effect transistor device for switch 33, can be fabricated in a single monolithic integrated circuit chip in and on a common substrate. This may not always be the most desirable manner of implementing the circuit of FIG. 2 since, for various reasons, certain of the components in this circuit might better be provided outside the chip in some circumstances. Field-effect transistor devices suitable for switch 33 may be ordinary field-effect devices capable of managing the power transfer from supply 34 to load means 35 or they may alternatively be the transistor devices described or mentioned in the copending application entitled "Semiconductor Apparatus" having Ser. No. 024,840 by T. E. Hendrickson, et al., and assigned to the present assignee.

Many electronic switching circuit applications involve controlling power transfers between a substantial power source and a significant power consuming load but with the control circuit operating from a relatively low voltage, constant polarity power supply. On the other hand, the substantial power source for supplying the major power consuming load will supply relatively high voltage, and this voltage may have either a constant or an alternating polarity. This situation can be found, for instance, in the present application and in the circuits disclosed in the copending application by T. E. Hendrickson, et al., entitled, "Alternating Polarity Power Supply Control Apparatus," having Ser. No. 973,463, and assigned to the present assignee, which makes use in the circuits disclosed therein of metal-oxide-semiconductor field-effect devices capable of controlling substantial power.

Further, the constant polarity, low voltage operated controlling circuit will often be a system in two parts with one part remotely located from the electronic switching circuit and the other part immediately connected to and directing operation of the primary power transfer control element. In the example of the copending application as just referred to, this primary power transfer control element would be the metal-oxide-semiconductor field-effect device mentioned. In the present application, this element would be switch 33. The remotely located part of the controlling system in the present application is that source which provides control signals A and B.

Often, the zero frequency voltage levels occurring in the remotely located part of the constant polarity, low voltage operated controlling system must be electrically isolated from differing zero frequency voltage levels occurring in the circuit portion immediately connected to and directing operation of the primary power transfer control element. The use of the present invention as shown in FIG. 1 provides the above mentioned electrical isolation through use of capacitors 15, 15', 25 and 25' of the circuit of FIG. 1. Similar capacitors are provided in comparable locations in FIG. 2.

The part of the controlling system remotely located from the primary device will be operated by constant polarity, low voltage power supply which is independent of the remainder of the system. The controlling system part immediately connected to and directing operation of the primary device must also be provided with a constant polarity, low voltage power supply. The circuit of FIG. 2 shows use not only of a p-channel metal-oxide-semiconductor field-effect transistor as the primary device for controlling power transfers from source 34 to the load means 35, but also shows means for supplying constant polarity, low voltage power to the controlling system part which immediately directs operation of the primary device. This constant polarity, low voltage power is developed from alternating polarity source 34.

As stated above, switch 33 is shown implemented in FIG. 2 as a p-channel MOSFET, designated 40, having a first channel terminating region, 41, a second channel terminating region 42, a gate region, 43, and a substrate region, 44. Terminating region 41 is connected to one side of power source 34 thru load means 35. The other channel terminating region 42 is connected to the other side of power source 34. As described in the latter above referenced copending application, field-effect transistor 40 is switched "on" when gate 43 is caused to become more negative than substrate 44, which is connected to channel terminating regions 41 and 42 through intrinsic PN junctions (not shown). This switching on of transistor 40 will cause a transfer of power from source 34 to load means 35. MOSFET 40 is rendered "off" by maintaining gate 43 at approximately the same potential as the substrate 44.

The required constant polarity, low voltage power supply means is provided in FIG. 2 by a filter and storage capacitor, 50, a rectifying means, 51, a regulation means, 52, and a current limiting means, 53. Capacitor 50 has one side thereof connected to the anode of rectifying means 51, and the other side thereof connected to substrate 44 of field-effect transistor 40. Rectifying means 51 has its cathode connected to the juncture of power source 34 and load means 35. Connected in parallel with capacitor 50 is a series combination of voltage regulating means 52, shown as a zener diode, and resistor 53, the latter used as a current limiting means. The voltage developed across zener diode 52 supplies the required constant polarity, low voltage for the controlling system part immediately connected to the primary power transfer control device, field-effect transistor 40. The voltage values available from this constant polarity, low voltage supply circuit are two in number, the first identified as reference voltage $V_{DD}$ which is provided at the juncture of voltage regulating means 52 and substrate 44. The second voltage value is identified as $V_{SS}$ which is provided at the juncture of current limiting means 53 and voltage regulating means 52. This voltage supply is such that the voltage developed across regulating means 52 has $V_{DD}$ more positive than $V_{SS}$. Further, $V_{DD}$ will be considered as the ground reference voltage for all the control circuit portions in FIG. 2.

The part of the controlling system in FIG. 2 which is immediately connected to and directly controls operation of the primary power transfer control device, MOSFET 40, is, as stated above, similar to the circuit shown in FIG. 1. Control signal A is presented to a rising signal detector, 100, and to a falling signal detector. Control signal B is again connected to a rising signal detector, 100', and to a falling signal detector, 200'. Rising signal detector 100' is identical to rising signal detector 100 so the details of detector 100' are not shown. Rising signal detector is similar to rising signal detector 10 of FIG. 1 except for the elimination of threshold switch circuit 14, the function of which is incorporated into the subsequent logical sorting means as will be described below. Falling signal detector 200' is identical to falling signal detector 200 and so the details of detector 200' are not shown. Falling signal detector is similar to falling signal detector 20 of FIG. 1.

The 2-input AND gates 30 and 31 shown in FIG. 1 are each shown implemented in FIG. 2 as a 2-input NAND gate connected to a 2-input NOR gate, the latter having both its inputs connected in common. This method of forming a 2-input AND gate using NAND and NOR logic components is well known, in the art, and is easily achieved using p-channel MOSFET integrated circuit technology. Furthermore, flip-flop 32 is shown as two interconnected 2-input NOR gates, an arrangement also well known. In the circuit of FIG. 2, the $\overline{Q}$ output of flip-flop 32 is connected to gate 43 of the primary power transfer control device, MOSFET 40. This is done because if gate 43 of MOSFET is placed at the voltage representing a logic zero, which is approximately the voltage $V_{SS}$, MOSFET 40 is switched "on." Thus, when R-S flip-flop 32 is set in response to proper changes in both control signals A and B, that is, when output $\overline{Q}$ is at a logic 1, output Q is the output providing the proper voltage to switch on MOSFET 40.

As stated above and shown in FIG. 2, rising signal detector 100 is similar to rising signal detector 10 of FIG. 1 except for the elimination of the threshold switch circuit 14 shown as AND gate 17 in the circuit of FIG. 1. The function of the threshold switch circuit 14 is incorporated into logic gates constituting AND gate 30 including NAND gate, 55, and NOR gate, 56. NAND gate 55 operates about a threshold just as does AND gate 17 in the circuit of FIG. 1. Furthermore, resistor 16 is connected to the most negative voltage available from the constant polarity, low voltage supply, $V_{SS}$, which is similar to resistor 16 connected to ground as shown in FIG. 1.

As stated above, falling signal detector 200 of FIG. 2 is similar to falling signal detector 20 of FIG. 1. Resistor 26 in FIG. 2 is connected to the most positive reference voltage, $V_{DD}$, available from the constant polarity, low voltage supply similar to the connection of resistor 26 to the positive supply voltage in FIG. 1. Also shown in the falling signal detector 200 of FIG. 2 is NAND gate 27 of FIG. 1 showing its connections to the constant polarity, low voltage supply voltages $V_{DD}$ and $V_{SS}$.

Figure 3A:
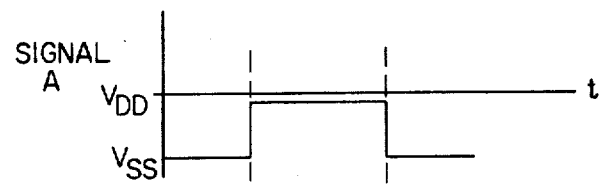
FIGS. 3A through 3G are voltage versus time graphs of voltages occurring in the circuit of FIG. 2 during operation thereof.

The operation of the circuit of FIG. 2 will now be described with reference to the signal versus time graphs shown in FIGS. 3A through G. In FIGS. 3A and 3C, control input signals A and B are shown changing between voltage levels $V_{SS}$ and $V_{DD}$. In practice, control signals A and B need only increase or decrease in value in an amount which exceeds a selected magnitude and at a rate which exceeds a selected rate of increase or decrease as determined by the differentiator circuits and the effective threshold switch circuits in the manner already described.

Figure 3B:
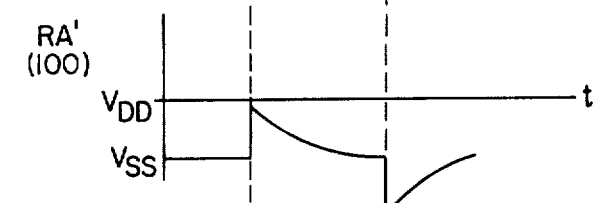
Figure 3C:
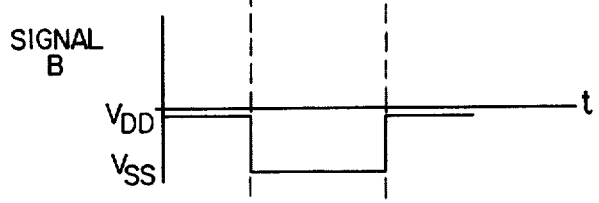
Figure 3D:
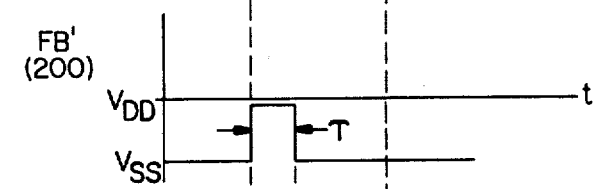
Figure 3E:
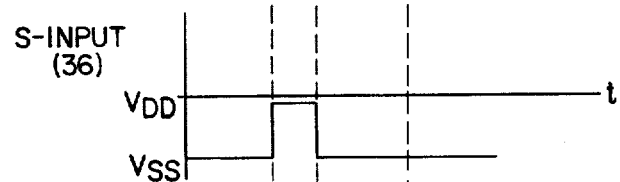
Figure 3F:
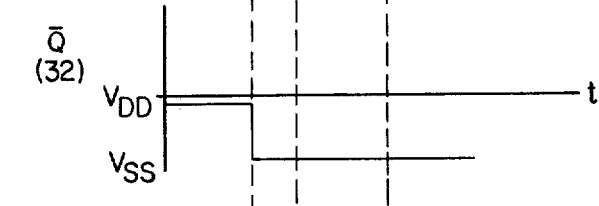

The output signal RA' of rising signal detector 100 is shown in FIG. 3B as a result of responding to the changing in value of control signal A shown in FIG. 3A. Of course, output signal RA' is simply the result of differentiating control signal A as accomplished by the detector 100 differentiator circuit elements, capacitor 15 and resistor 16. Signal RA' differs from what output signal RA of rising signal detector 10 in FIG. 1 would be, for the same applied control signal A shown in FIG. 3A, because of the elimination in detector 100 in FIG. 2 of threshold switch circuit 14 shown in detector 10 in FIG. 1. As explained above, this elimination is possible in detector 100 since the function of threshold switch circuit 14 in FIG. 1 has been incorporated into AND gate 30 in FIG. 2. On the other hand, the output signal FB' of falling signal detector 200' is identical to what output signal FB of falling signal detector 20 in the circuit of FIG. 1 would be for the same applied control signal B shown in FIG. 3. (This is so because NAND gate 27 is present in both detector 200 and detector 20.) Output signal FB' of falling signal detector 200 is shown in FIG. 3D.

In the following, positive logic continues to be used as was implied in earlier portions of the description of the system shown in FIG. 2. That is, the more positive logic voltage level (approximately $V_{DD}$) in the controlling system part immediately connected to MOSFET 40 is a logic one, and the more negative logic voltage level (aproximately $V_{SS}$) is a logic zero.

The portions of control signal A and control signal B shown in FIGS. 3A and 3C, respectively, are in opposite phase synchronism. That is, control signal A goes from a logic zero to a logic one and then back to a logic zero at substantially the same change times that control signal B goes from a logic one to a logic zero and then back to a logic one. Again, output signal RA' of rising signal detector 100, in response to changing control signal A, is shown in FIG. 3B. The concurrent output signal FB' of falling signal detector 200', in response to control signal B changing in opposite phase, is shown in FIG. 3D.

Thus, FIG. 3B shows that signal RA' reaches the voltage level of a logic one thereby exceeding the threshold level for some period of time of NAND gate 55 at the input thereof to which signal RA' is presented. FIG. 3D shows that signal FB' goes from a logic zero to a logic one concurrently with times that signal RA' exceeds the threshold of gate 55. Since signal FB' is presented to another input of NAND gate 55, AND gate 30, which includes gate 55, will have output 36 thereof switched to a logic one. Thus, input S of flip-flop 32, to which output 36 of AND gate 30 is connected, will also be at a logic one, i.e. approximately at voltage $V_{DD}$. This logic one will appear at input S of flip-flop 32 during the overlap of (i) the pulse of approximately width T appearing in signal FB', and (ii) the duration of approximately T during which signal RA' is greater than the threshold voltage of NAND gate 55 of AND gate 30 at the input thereof to which signal RA' is presented. A logic one at input S of flip-flop 32 with a logic zero continuing at input R thereof leads to output Q of flip-flop 32 going to a logic one and output Q voltage becoming $V_{SS}$. See FIGS. 3E and 3F.

Figure 3G:
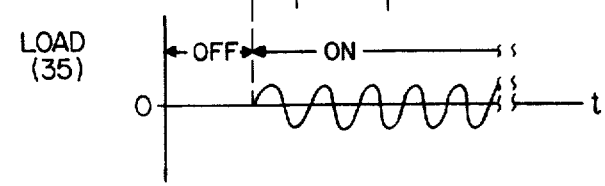

The $\overline{Q}$ output of flip-flop 32 being at voltage $V_{SS}$ leads to MOSFET 40 having gate 43 thereof more negative than substrate 44. MOSFET 40 thus switches "on" as shown in FIG. 3G, and permits the transferring of power from source 34 to load means 35.

The overlap described just above will end as control signals A and B return to the logic states they were in at time zero in FIGS. 3A and 3C, respectively. The output of AND gate 30 will then return to logic zero. This will result in input S of flip-flop 32 returning to logic zero also because S is connected to output 36 of AND gate 30.

In a similar sequence to that which led to a logic one being developed at input S of flip-flop 32, a logic one will be developed at output 37 of AND gate 31 and at input R of flip-flop 32 to which output 37 is connected. That is, the voltage at output 37 of AND gate 31 and at input R of flip-flop 32 is approximately $V_{DD}$, while the voltage input S is approximately $V_{SS}$. Then output Q of flip-flop 32 will be at logic zero and output $\overline{Q}$ will be at a logic one, i.e. the voltage at output $\overline{Q}$ will be approximately $V_{DD}$ as will gate 43 of MOSFET 40 to which ouput $\overline{Q}$ is connected. Thus, gate 43 will be at the same voltage potential as is substrate 44. This occurrence, of course, will cause MOSFET 40 to be in the "off" condition.

As earlier stated, the circuit of FIG. 2, with the possible exception of rectifying means 51 and capacitor 50, may be fabricated in and on a single monolithic integrated circuit chip using standard technology for providing p-channel MOSFETS in such a chip. Rectifying means 51 must be electrically isolated from the common potential of substrate 44 of MOSFET 40 for proper circuit operation. Thus, rectifier 51 cannot have any portions thereof in common with any region of substrate 44. However, rectifying means could be provided in or on the monolithic integrated circuit chip using various isolation technologies.

Capacitor 50 is typically to have a capacitance value which may not be practical for fabricating in the same integrated circuit chip as the rest of the circuitry shown in FIG. 2. Hence, a component external to the integrated circuit chip might be used to achieve the desired capacitance value.

The embodiments of the invention in which an exclusive property or right is claimed are defined as follows:

1. An electronic switching circuit receiving first and second control signals, said electronic switching circuit being capable of providing a logic output signal having a phasing of value changes therein similar to that phasing of changes in value of a selected one of said first and said second control signals for those changes of said selected signal which are sufficient in magnitude and rate of change, but only for each such change in said selected signal which is accompanied by a change of value in an opposite direction in that remaining one of said first and second control signals occurring sufficiently concurrently therewith, said electronic control circuit comprising:

a first rising signal detector having an input region for receiving said first control signal, and having an output region, said first rising signal detector being capable of providing an output indication at said output region if said first control signal has an increase in value which exceeds a selected magnitude and also exceeds a selected rate of increase;

a second rising signal detector having an input region for receiving said second control signal, and having an output region, said second rising signal detector being capable of providing an output indication at said output region if said second control signal has an increase in value which exceeds a selected magnitude and also exceeds a selected rate of increase;

a first falling signal detector having an input terminal for receiving said first control signal, and having an output region, said first falling signal detector being capable of providing an indication at said output region if said first control signal has a decrease in value which exceeds a selected magnitude and also exceeds a selected rate of decrease;

a second falling signal detector having an input region for receiving said second control signal, and having an output region, said second falling signal detector being capable of providing an indication at said output region if said second control signal has a decrease in value which exceeds a selected magnitude and also exceeds a selected rate of decrease; and a logical sorting means having a first input connected to said first rising signal detector output region, a second input electrically connected to said second rising signal detector output region, a third input electrically connected to said first falling signal detector output region, and a fourth input electrically connected to said second falling signal detector output region, and with said logic sorting means having an output region, said logic sorting means being capable of providing said electronic switching circuit logic output signal at said logical sorting means output region in a first state when output indications occur substantially concurrently at said first rising signal detector output region and said second falling signal detector output region, and of providing said electronic switching circuit logic output signal at said logical sorting means output region in a second state when output indications occur substantially concurrently at said first falling signal detector output region and said second rising signal detector output region.

2. The circuit of claim 1 wherein one of said rising signal detectors and one of said falling signal detectors each further comprises a rate-of-change circuit having an input and an output, said rate-of-change circuit being capable of providing an output signal at said rate-of-change circuit output having a magnitude which depends on rates of change of value increases and decreases occurring in signals applied to said rate-of-change circuit input.

3. The circuit of claim 2 wherein siad one of said rising signal detectors and said one of said falling signal detectors each further comprises a threshold switch circuit having an input and an output, with said threshold switch circuit input being electrically connected to said rate-of-change circuit output, said threshold switch circuit being capable of providing an output indication at said threshold switch circuit output when a selected threshold magnitude is crossed during value changes in a signal applied to said threshold switch circuit input.

4. The circuit of claim 2 wherein said rate-of-change circuit comprises a rate capacitance electrically connected between said rate-of-change circuit input and output and a rate resistance electrically connected to that side of said capacitance connected toward said rate-of-change circuit output.

5. The circuit of claim 2 wherein a first transfer control field-effect device is provided in and on a first substrate, said first transfer control field-effect device comprising:

a first transfer control field-effect device channel region located at least in part in a first selected region of said first substrate;

first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes an electrical power supply means and a load means, and said first field-effect device second terminating region being electrically connected to a second terminal means adapted for electrical connection to said first circuit portion arrangement; and a first transfer control field-effect device gate region capable of effecting, upon electrical energization thereof, any current flow occurring through said first transfer control field-effect device channel region as a result of electrical energization of said first transfer control field-effect device first and second terminating regions; said first transfer control field-effect device gate region being electrically connected to said logical sorting means output region; and wherein an energy storage means having first and second polarity regions between which said energy storage means is capable of providing electrical energy storage, said energy storage means first polarity region being electrically connected to said first substrate with said energy storage means being electrically connected between said first substrate and said first circuit portion.

6. The circuit of claim 3 wherein said logic sorting means further comprises:

a first logic gate circuit having first and second inputs and an output, said first logic gate circuit first input being electrically connected to said first rising signal detector output region, and said first logic gate circuit second input being electrically connected to said second falling signal detector output region;

a second logic gate circuit having first and second inputs and having an output, said second logic gate circuit first input being electrically connected to said second rising signal detector output region, and said second logic gate circuit second input being electrically connected to said first falling signal detector output region; and a flip-flop means having a first input and a second input, and an output, said second input being electrically connected to a selected one of said first and second logic gate circuit outputs, and said first input being electrically connected to that remaining one of said first and second logic gate circuit outputs.

7. The circuit of claim 4 wherein said rate capacitance is electrically connected directly to said rate-of-change circuit input and said rate-of-change circuit output.

8. The circuit of claim 5 wherein said first and econd rising signal detectors, said first and second falling signal detectors, and said logical sorting means are also provided in and on said first substrate.

9. The circuit of claim 5 wherein said energy storage means has connected in parallel therewith a supply voltage regulating means.

10. The circuit of claim 5 wherein said one of said rising signal detectors and said one of said falling signal detectors each further comprises a threshold switch circuit having an input and an output, with said threshold switch circuit input being electrically connected to said rate-of-change circuit output, said threshold switch circuit being capable of providing an output indication at said threshold switch circuit output when a selected threshold magnitude is crossed during value changes in a signal applied to said threshold switch circuit input.

11. The circuit of claim 6 wherein said first logic gate circuit is effectively an AND logic gate circuit and said second logic gate circuit is effectively an AND gate circuit.

12. The circuit of claim 8 wherein said first and second rising signal detectors, said first and second falling signal detectors, and said logical sorting means are electrically operated at least in part by voltage occurring across said energy storage means or a fraction of such voltage.

13. The circuit of claim 9 wherein said energy means is a storage capacitance means and said voltage regulating means is a series combination of a supply resistance means and a zener diode means.

14. The circuit of claim 9 wherein said one of said rising signal detectors and said one of said falling signal detectors further comprises a threshold switch circuit having an input and an output, and said threshold switch circuit input being electrically connected to said rate-of-change circuit output, said threshold switch circuit being capable of providing an output indication at said threshold switch circuit output when a selected threshold magnitude is crossed during value changes in a signal applied to said threshold switch circuit input.

15. The circuit of claim 11 wherein said flip-flop means is an R-S flip-flop means with said first input being an R input and said second input being an S input.

16. The circuit of claim 12 wherein said energy storage means is a storage capacitance means.

* * * * *